US007911236B2

(12) United States Patent
 Asam (10) Patent No.: US 7,911,236 B2
(45) Date of Patent: Mar. 22, 2011

(54) DETECTION CIRCUIT AND DETECTION METHOD

(75) Inventor: Michael Asam, Inchenhofen (DE)

(73) Assignee: Intel Mobile Communications GmbH, Neubiberg (DE)

( * ) Notice: Subject to any disclaimer, the term of this patent is extended or adjusted under 35 U.S.C. 154(b) by 81 days.

(21) Appl. No.: 11/603,888

(22) Filed: Nov. 22, 2006

(65) Prior Publication Data
 US 2008/0116970 A1    May 22, 2008

(51) Int. Cl.
  *H03K 5/153* (2006.01)
(52) U.S. Cl. .................................. 327/58; 327/61
(58) Field of Classification Search ............ 327/58–62
  See application file for complete search history.

(56) References Cited

U.S. PATENT DOCUMENTS

| | | | | |
|---|---|---|---|---|
| 4,441,040 | A * | 4/1984 | Mundel et al. | 327/561 |
| 4,791,380 | A | 12/1988 | Chiappetta | |
| 5,127,352 | A * | 7/1992 | Kulpa | 114/144 E |
| 5,764,107 | A * | 6/1998 | Stone | 330/279 |
| 6,566,944 | B1 | 5/2003 | Pehlke et al. | |
| 6,777,996 | B2 * | 8/2004 | Smith, Jr. | 327/309 |
| 6,943,530 | B2 * | 9/2005 | Cheiky et al. | 320/162 |
| 7,167,062 | B2 * | 1/2007 | van Zeijl | 331/185 |
| 7,375,603 | B2 * | 5/2008 | Dupont et al. | 333/24 R |
| 2003/0189453 | A1 * | 10/2003 | Smith, Jr. | 327/320 |
| 2003/0216863 | A1 | 11/2003 | Fielder | |
| 2003/0224740 | A1 | 12/2003 | Takano et al. | |
| 2006/0046324 | A1 * | 3/2006 | Chikamatsu et al. | 438/17 |
| 2007/0268220 | A1 * | 11/2007 | Lee et al. | 345/76 |
| 2007/0285074 | A1 * | 12/2007 | Maekawa et al. | 323/293 |

FOREIGN PATENT DOCUMENTS

| | | |
|---|---|---|
| EP | 0420128 A | 4/1991 |
| EP | 0843420 A | 5/1998 |
| FR | 2797071 A | 2/2001 |
| GB | 2356756 A | 5/2001 |
| WO | 0137229 A | 5/2001 |

OTHER PUBLICATIONS

European Search Report for Application No. 07121125.4 dated Dec. 10, 2009.
Thomann, et al. "Fully Integrated W-CDMA IF Receiver and IF Transmitter Including IF Synthesizer and On-Chip VCO for UMTS Mobiles" IEEE Journal of Solid-State Circuits, IEEE Service Center, Piscataway, NJ, US, vol. 26, No. 9, Sep. 1, 2001, XP011061594, ISSN: 0018-9200, p. 1411-1412.
Senguttuvan, et al. "A Built-in-Test-Based Reconfiguration Scheme for Wireless Systems for Increased Quality of Service (QoS)" Circuits and Systems, 2006, MWSCAS '06, 49th IEEE International Midwest Symposium on IEEE, PI, Aug. 1, 2006, pp. 633-637, XP031113675.
Alan Chi Wei Wong, et al., "A 1 V Wireless Transceiver for an Ultra-Low-Power SoC for Biotelemetry Applications", IEEE Journal of Solid-State Circuits, vol. 43, No. 7, Jul. 2008, p. 1511-1521.

* cited by examiner

*Primary Examiner* — Long Nguyen
(74) *Attorney, Agent, or Firm* — Eschweiler & Associates, LLC (57) ABSTRACT

A detection circuit includes a bias circuit configured to generate a first bias voltage and a second bias voltage. The detection circuit further includes a storage device configured to store a detection value corresponding to an amplitude of a radio frequency signal received at a detector input. A series connection of a first diode element and a second diode element includes first tap to receive the first bias voltage and the radio frequency signal, a second tap which is coupled to a connection node of the first and the second diode element to receive the second bias voltage and a third tap to provide the detection value.

8 Claims, 5 Drawing Sheets

FIG 9

DETECTION CIRCUIT AND DETECTION METHOD

FIELD OF THE INVENTION

The invention is directed to the field of communications, and more particularly to a detection circuit and associated method.

BACKGROUND OF THE INVENTION

The requirements for the signal quality of transmitting devices become more stringent as the need for high data rates and increasing mobility grows. The modern mobile radio standards, such as Universal Mobile Telecommunications System (UMTS), Wideband Code Division Multiple Access (WCDMA), Global System for Mobile Communication (GSM), Enhanced Data Rates for GSM Evolution (EDGE), Bluetooth Medium Data Rate or Wireless Local Area Network (WLAN) according to 802.11a/b/g require special modulation types for data transmission which modulate both the phase and the amplitude of a carrier signal at the same time.

Simultaneous amplitude and phase modulation makes it possible to achieve higher data transmission rates and thus better bandwidth efficiency. The mobile radio standards mentioned above envisage, for example, the use of quadrature phase shift keying (QPSK), eight phase shift keying (8-PSK), or quadrature amplitude modulation (QAM) as modulation types for the data transmission. Depending on the selected application for the individual mobile radio standards, these high-quality modulation types are used not only for data transmission from a base station to a mobile communication appliance but also from the mobile communication appliance to the base station.

Many modern mobile radio standards, as for example UMTS or GSM/EDGE, control the output power of a transmitted radio frequency signal. To this end, a gain factor of a power amplifier in a transmitter path can be set according to a desired output power. As the output power corresponds to an amplitude of the radio frequency signal, it is possible to derive a desired gain factor as a function of an actual amplitude value of the radio frequency signal and a reference amplitude value corresponding to the desired gain factor.

Figure 11:
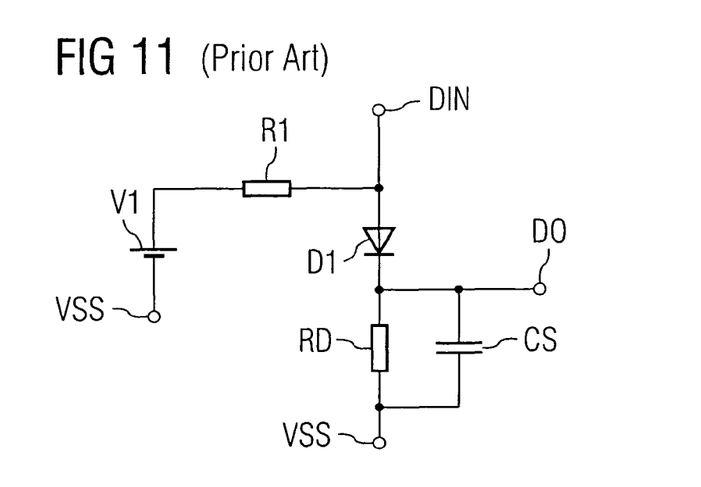

The actual amplitude value can be measured or detected using an amplitude detection circuit. FIG. 11 shows an embodiment of a conventional detection circuit which derives a detection signal as a function of a radio frequency signal at its input DIN. The detection circuit comprises a diode element D1. An anode terminal of the diode element D1 is coupled to the detector input DIN and to a voltage source V1 via a resistor R1. A cathode terminal of the diode element D1 is coupled to the detector output D0 and further to a reference potential tap VSS via a capacitor CS and a parallel connected resistor RD.

The voltage source V1 provides a bias voltage to the anode terminal of the diode D1. A radio frequency signal is received at the detector input DIN which adds to the bias voltage. During the positive alternation of the radio frequency signal a current through the diode D1 charges the capacitor CS up to a potential resulting from the bias voltage plus the amplitude of the radio frequency signal. During the negative alternation, the diode D1 is blocked, whereas the voltage at the detector output D0 remains mainly constant. A voltage difference between the anode and the cathode terminal of the diode D1, which is reversed biased during the negative alternation, results to almost two times the amplitude of the radio frequency signal.

Assuming that the voltage source V1 provides a bias voltage of 3V, the amplitude of the radio frequency signal equals to 5V and a voltage drop of the forward biased diode D1 equals to 0.5V, the capacitor CS will be charged up to a voltage of 5V+3V−0.5V=7.5V during the positive half-wave or alternation. During the negative half-wave or alternation, the voltage at the anode terminal of the diode D1 would result to 3V−5V=−2V, leading to a voltage difference of 7.5V−(−2V)=9.5V, which is almost twice the amplitude of the radio frequency signal of 5V.

It is therefore desired to dimension the diode D1 such that it withstands twice the expected maximum amplitude of the radio frequency signal.

The dynamic range of a detection circuit can be determined by a lower and an upper limit. The lower limit corresponding to a minimum amplitude to be detected can be defined as a minimum slope of a characteristic curve of the detection circuit, wherein the slope is defined as a ratio between an output voltage difference $\Delta UDET$ and an input amplitude voltage difference $\Delta URF$. The upper limit of the dynamic range can be defined by the maximum amplitude to be detected without harming or destroying the detection circuit, especially the diode D1 because of extensive reverse biasing. In other words, the upper limit of the dynamic range can be a function of the breakdown voltage of the diode D1.

Modern mobile radio standards can require a wide dynamic range for the amplified radio frequency signal. To achieve a wider dynamic range, for example the withstand voltage of the detection circuit can be increased by changing technology parameters. However, this may affect the performance of the detection circuit. The dynamic range can further be enlarged by providing amplification or attenuation elements at the input of the detection circuit which both affects the characteristic curve of the detection circuit and conditions additional control circuits to control the amplification or attenuation elements.

BRIEF DESCRIPTION OF THE DRAWINGS

The invention is explained in detail below using exemplary embodiments with reference to the drawings in which.

DETAILED DESCRIPTION OF THE INVENTION

In the following description further aspects and embodiments of the present invention are summarized. In addition, reference is made to the accompanying drawings, which form a part hereof, and in which is shown by way of illustration, in which the invention may be practiced. The embodiments of the drawings present a description in order to provide a better understanding of one or more aspects of the present invention. This description is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

Figure 1:
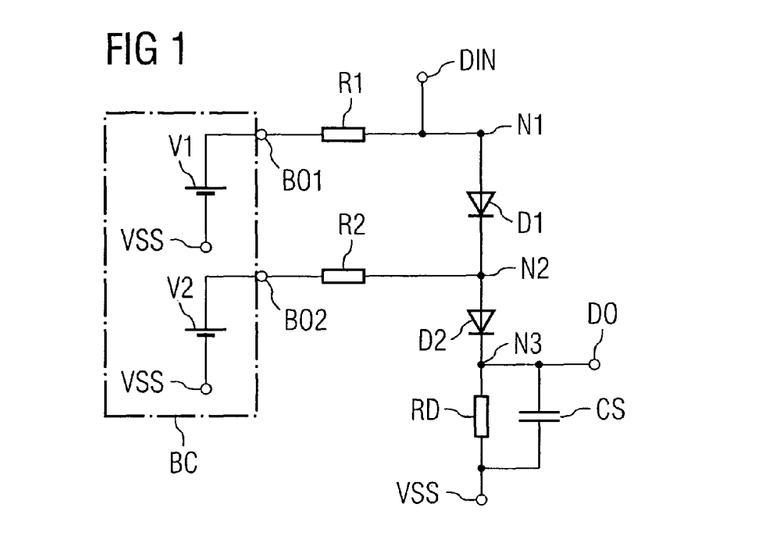
FIG. 1 is a schematic diagram illustrating a first embodiment of a detection circuit.

FIG. 1 shows an exemplary embodiment of a detection circuit. It comprises a bias circuit BC, a detector input DIN and a series connection of a first diode element D1 and a second diode element D2. The bias circuit BC comprises a first voltage source V1 which is coupled between a reference voltage tap VSS and a first bias output BO1. The bias circuit BC further comprises a second voltage source V2 which is coupled between the reference voltage tap VSS and a second bias output BO2.

in one embodiment, the first diode element is coupled between a first tap N1 and a second tap N2. Accordingly, the second diode element D2 is coupled between the second tap N2 and a third tap N3. The first tap N1 is coupled to the first bias output BO1 via a resistive element R1 and to the detector input DIN. The second tap N2 is coupled to the second bias output BO2 via a further resistive element R2. The third tap N3 is coupled to the detector output DO and further to the reference voltage tap VSS via a parallel connection of a capacitor CS and a resistor RD which together form a capacitive element.

The first and the second voltage source V1, V2 generate a first and a second bias voltage at their respective outputs BO1, BO2. A radio frequency signal, for example from an amplifier, is provided at the detector input DIN. A first intermediate signal is derived as a function of the first bias voltage and the radio frequency signal. In one embodiment, the first and the second bias voltage can be chosen such that the voltage difference between the first and the second bias voltage corresponds to a forward bias voltage of the first diode element D1. A second intermediate signal at the second tap N2 is derived by rectifying the first intermediate signal at the first tap N1 depending on the second bias voltage and an instantaneous value of the first intermediate signal.

A detection value corresponding to an amplitude of the radio frequency signal is stored within the capacitor CS. A third intermediate signal at the third tap N3 is derived by rectifying the second intermediate signal depending on the stored detection value and an instantaneous value of the second intermediate signal. Depending on the third intermediate signal, the stored detection value is adjusted. To this end, the capacitive element CS, RD is charged or discharged depending on the third intermediate signal. The voltage at the first tap N1 results as the sum of the first bias voltage and the instantaneous voltage of the radio frequency signal. Due to a voltage drop along the diode element D1, a voltage at the second tap N2 is lower than the voltage at the first tap N1 by the forward bias voltage of the diode element D1. A voltage at the third tap N3 corresponds to the detection value stored in the capacitor CS. If the voltage at the second tap N2 is higher than the voltage at the third tap N3, the second diode element D2 is forward biased which results in a charging current into the capacitor CS. If the voltage at the second tap N2 is lower than the voltage at the third tap N3, the capacitor CS can discharge via the resistor RD which acts as a discharging device.

The capacitor CS will have a minimum value stored which corresponds to the second bias voltage. As a consequence, the voltage at the second tap N2 cannot fall below the second bias voltage because a reverse biased diode element D2 prevents a further voltage drop at the second tap N2.

The voltage at the first tap N1 follows the instantaneous value of the radio frequency signal in one embodiment. Therefore, also the first diode element D1 can be reversed biased, if a resulting voltage at the first tap N1 is below the second bias voltage. Resistive couplings R1, R2 are usually high-ohmic resulting in a low current from and to the bias circuit BC.

Figure 2:
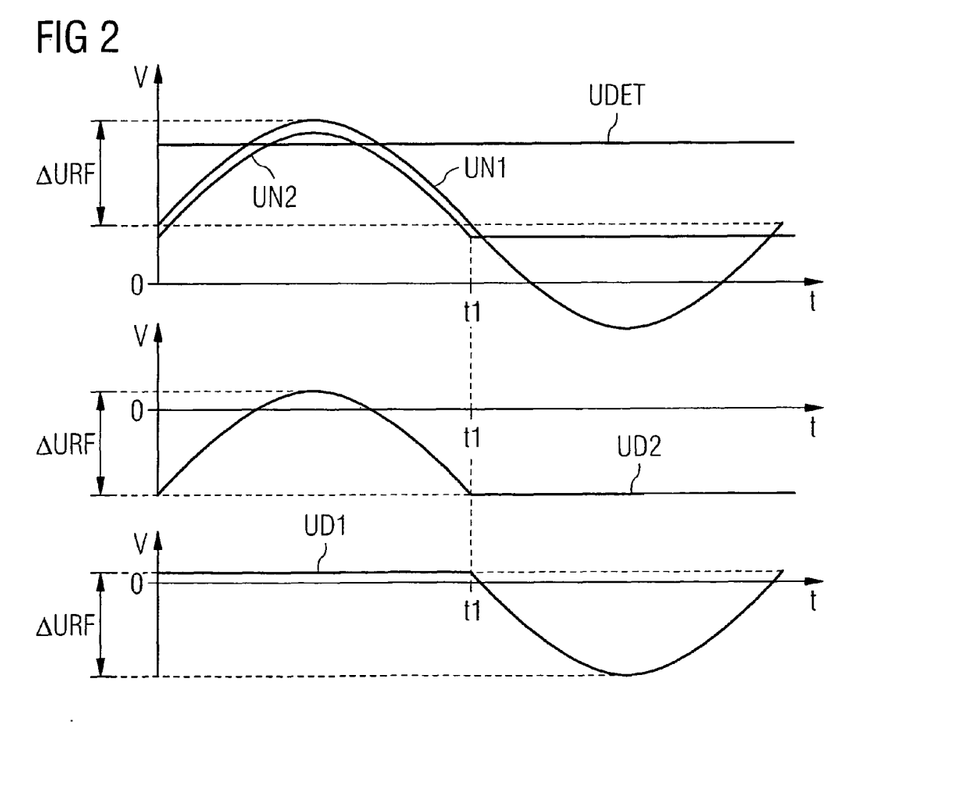
FIG. 2 is a graph illustrating a signal timing diagram of the signals within a detection circuit.

FIG. 2 shows a signal timing diagram of exemplary signals which can be measured in a detection circuit according to the embodiment shown in FIG. 1. In the diagram, the signal UN1 denotes the voltage at the first tap N1 and the signal UN2 denotes the voltage at the second tap N2. The signal UDET denotes the detection value which can be measured at the detector output DO or the third tap N3, respectively. The signal UN1 comprises a signal amplitude of $\Delta$URF and has a mean value corresponding to the first bias voltage provided at the first bias output BO1. During the positive alternation, that means until the instant t1, the signal UN2 is lower than the signal UN1 by the voltage drop of the forward biased first diode element D1. The detection value UDET is smaller than the maximum value of the signal UN2 by the voltage drop of the second diode element D2.

The signal UN1 results from the first bias voltage and the radio frequency signal which is chosen, for example, as a sinusoidal signal with a signal amplitude of $\Delta$URF. The radio frequency signal could also comprise other signal forms, for example a square wave or a trapezoid signal.

The signal UD2 denotes a voltage difference between the second tap N2 and the third tap N3, that means a voltage across the second diode element D2. Accordingly, the second diode element D2 is forward biased at the time during which the voltage of the signal UN2 is higher than the detection value UDET. During the remaining time, the second diode element D2 is reverse biased with a maximum negative voltage that is smaller than the signal amplitude $\Delta$URF of the radio frequency signal.

The signal UD1 denotes a voltage difference between the first tap N1 and the second tap N2, that means a voltage over the first diode element D1. During the positive alternation, the first diode element D1 is forward biased resulting in a small forward bias voltage. During the negative alternation of the radio frequency signal, the second diode element D2 is reverse biased such that the voltage at the second tap N2 denoted by the signal UN2 remains at a minimum voltage which corresponds to the second bias voltage provided at the second bias output BO2. Accordingly, the voltage of the first signal UN1 falls below the voltage of the second signal UN2 resulting in a negative voltage over the first diode element D1. Again, the maximum negative value of the signal UD1 is smaller than the signal amplitude SURF of the radio frequency signal. During this time, the signal UD2 remains at its respective maximum negative value.

As one can see from the diagram, the first diode element D1 as well as the second diode element D2 reach a maximum negative value which is smaller than an amplitude of the radio frequency signal. Accordingly, a given breakdown voltage of a first and the second diode element D1, D2 according to the proposed detection circuit can be dimensioned as being about half the breakdown voltage of a diode used in a conventional detection circuit for a desired maximum amplitude of a radio frequency signal. In other words, the dynamic range of the detection circuit according to the embodiment can be doubled compared to a conventional detection circuit, in each case using diode elements having the same breakdown voltage.

Accordingly, in one embodiment, by providing a series connection of a first and the second diode element D1, D2 and additionally providing a bias voltage to the second diode element D2, a voltage difference between a maximum and a minimum value of the radio frequency signal or the signal at the first tap N1, respectively, is divided onto the first and the second diode element D1, D2.

The signal UN1 corresponds to a first intermediate signal resulting from the first bias voltage and the radio frequency signal. Accordingly, the signal UN2 corresponds to a second intermediate signal derived from the first intermediate signal using the first diode element D1 which rectifies the first intermediate signal depending on the second bias voltage. The third intermediate signal corresponds to the signal at the third tap N3 which equals the detection value provided at the detector output DO for a radio frequency signal having a constant signal amplitude ΔURF. If the amplitude ΔURF changes over time, the detection value stored in the capacitive element CS, RD is adjusted according to the third intermediate signal.

Figure 3:
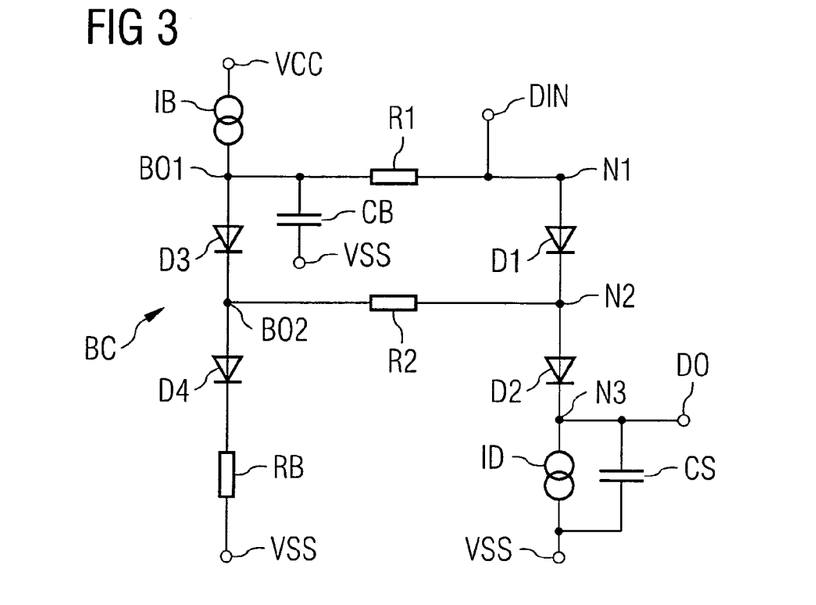
FIG. 3 is a schematic diagram illustrating a second embodiment of a detection circuit.

FIG. 3 shows another embodiment of a detection circuit. The bias circuit BC comprises a current source IB and a series connection of a third and a fourth diode element D3, D4. The current source IB is coupled to a supply voltage tap VCC and provides a current to the third and the fourth diode element D3, D4. A cathode terminal of the fourth diode element D4 is coupled to a reference voltage tap VSS via a bias resistor RB which determines an operational point of the bias circuit BC. An anode terminal of the third diode element D3 forms the first bias output BO1 and an anode terminal of the fourth diode element D4 forms the second bias output BO2.

The detection circuit further comprises a capacitor CB for stabilizing the first bias voltage which is coupled to the first bias output BO1. Compared to the embodiment shown in FIG. 1, the resistor RD for discharging the capacitor CS is replaced in one embodiment by a current source ID which can comprise a current mirror, for example. The current source ID acts as a discharging device and forms a storage device together with the capacitor CS connected in parallel.

in one embodiment, the third diode element D3 has the same characteristic as the first diode element D1, and the fourth diode element D4 has the same characteristic as the second diode element D2. In another embodiment all diode elements D1, D2, D3, D4 have the same characteristic.

If the diode elements D1 and D3 have the same characteristic, a voltage drop in case of forward biasing between the first and the second bias output BO1, BO2 and between the first and the second tap N1, N2 will be the same, independent of changes of a supply voltage or an operational temperature. Deviations of the characteristic curve of the detection circuit depending on the temperature can be compensated for this way. The resistive couplings R1, R2 can be chosen in one embodiment to be high-ohmic such that a voltage at the first and the second tap N1, N2 does not cause a current and a current path of the bias circuit, which is formed by the current source IB, the diode element D3, D4 and the bias resistor RB.

In one embodiment, if the resistance of the resistor R2 is reduced, the second intermediate signal at the second tap N2 can cause a current from the second tap N2 to the bias output BO2 which increases the current through the fourth diode element D4 and the bias resistor RB. This results in a higher voltage drop along the bias resistor RB and, as a consequence, respective higher bias voltages at the first and the second bias output BO1, BO2. In this case, the mean level of the first and the second intermediate signal at the first and the second tap N1, N2 increase, which results in a higher voltage for the detection value stored in the storage device CS, ID. In other words, the signal amplitude of the radio frequency signal not only adds to a constant bias voltage to derive the detection value but also increases the bias voltage resulting in an increased effect on the detection value. in one embodiment, the detection value is therefore changed or increased for small signal amplitudes of the radio frequency signal which leads to a lowering of the lower limit of the dynamic range of the detection circuit.

Figure 4:
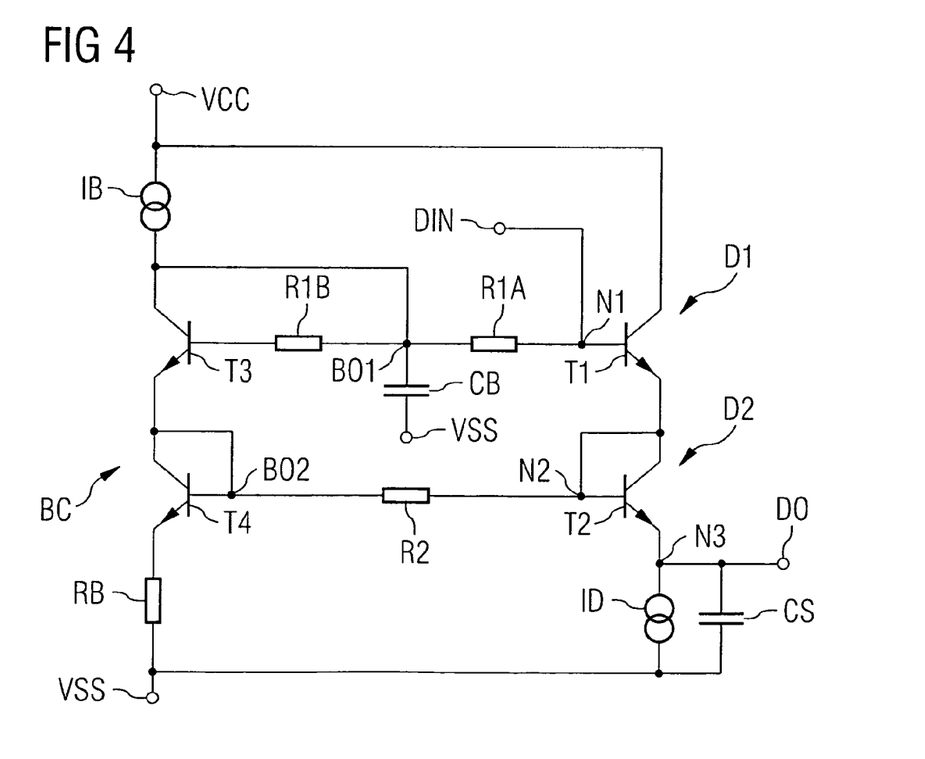
FIG. 4 is a schematic diagram illustrating a third embodiment of a detection circuit.

FIG. 4 shows another embodiment of a detection circuit. In this embodiment, the diode elements are formed by bipolar transistors T1, T2, T3, T4. To this end, the collector terminal of the first transistor T1 is coupled to the supply voltage tap VCC. The first tap N1 is formed by the base terminal of the transistor T1. In this embodiment, the base-emitter diode of the transistor T1 is used to rectify the input signal formed by the first bias voltage and the radio frequency signal.

Accordingly, the second diode element D2 is formed by the transistor T2 whose base and collector terminals are connected, also using the base-emitter diode to achieve a diode behavior. The bias circuit BC comprises the third and the fourth transistor T3, T4. The fourth transistor T4 is also wired as a diode by connecting the base and the collector terminal. The base terminal of the third transistor T3 is coupled to the first bias output BO1 via a resistor R1B. The first bias output BO1 is further coupled to the collector terminal of the transistor T3 which also causes the transistor T3 to be wired as a diode. The first bias voltage at the first bias output BO1, which again is stabilized using the capacitor CB, is provided to the first node N1 via the resistor R1A. The resistors R1A and R1B can have the same resistance in one embodiment, resulting in an identical voltage drop along the resistors R1A, R1B which compensates for a gain factor β of the transistors T1, T3.

As described before for the embodiment shown in FIG. 3, it can be desirable in one embodiment that transistors T1 and T3 and T2, T4 each have the same characteristics. The function of the embodiment shown in FIG. 4 corresponds to the embodiment shown in FIG. 3.

Figure 5:
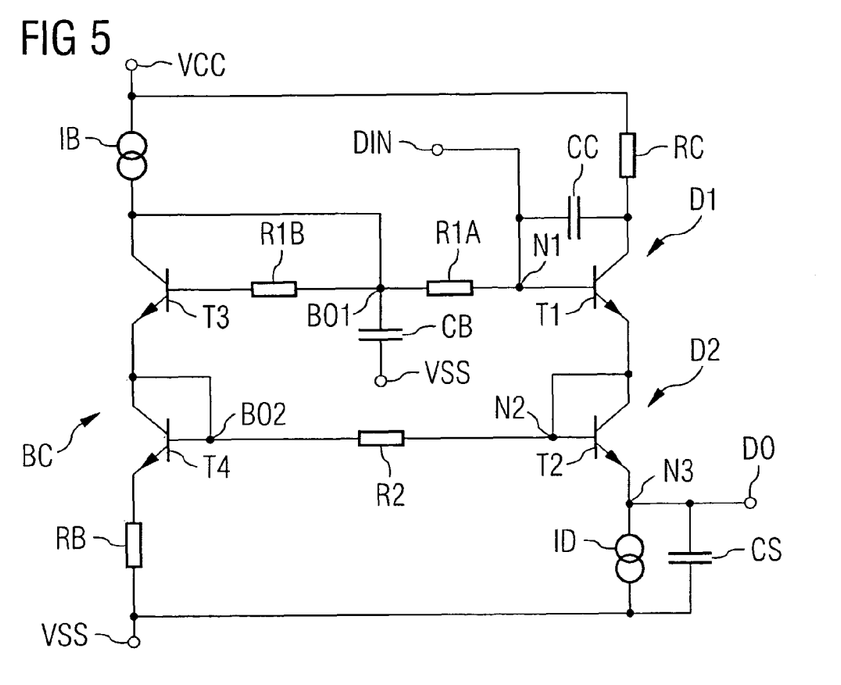
FIG. 5 is a schematic diagram illustrating a fourth embodiment of a detection circuit.

FIG. 5 shows another embodiment of a detection circuit. In addition to the embodiment shown in FIG. 4, the base terminal of the first transistor T1 is coupled to its collector terminal via a coupling capacitor CC. The collector terminal of the first transistor T1 is coupled to the supply voltage tap VCC via a further resistor RC. Using the proposed capacitor CC, in one embodiment it can be prevented that for higher amplitudes of the radio frequency signal at the detector input DIN, a voltage at the base terminal of the transistor T1 becomes higher than a voltage at its collector terminal, thus forward biasing its base-collector diode which limits the amplitude of the input signal. By using the coupling capacitor CC, the collector voltage of the transistor T1 increases with the voltage of the radio frequency signal and blocks the base-collector diode. A DC voltage difference between the collector and the base terminal of the first transistor T1 remains unaffected by the capacitor CC which is blocking for DC signals.

In other words, in one embodiment the capacitor CC and the resistor RC form a high-pass filter which blocks the DC bias voltage and lets pass the positive alternation of the radio frequency signal. The resistor RC can also be replaced by an inductor in another embodiment to form the proposed high-pass filter.

According to various embodiments, diodes as well as transistors can be used as diode elements. The transistors can be NPN- or PNP-bipolar transistors or field-effect transistors.

Figure 6:
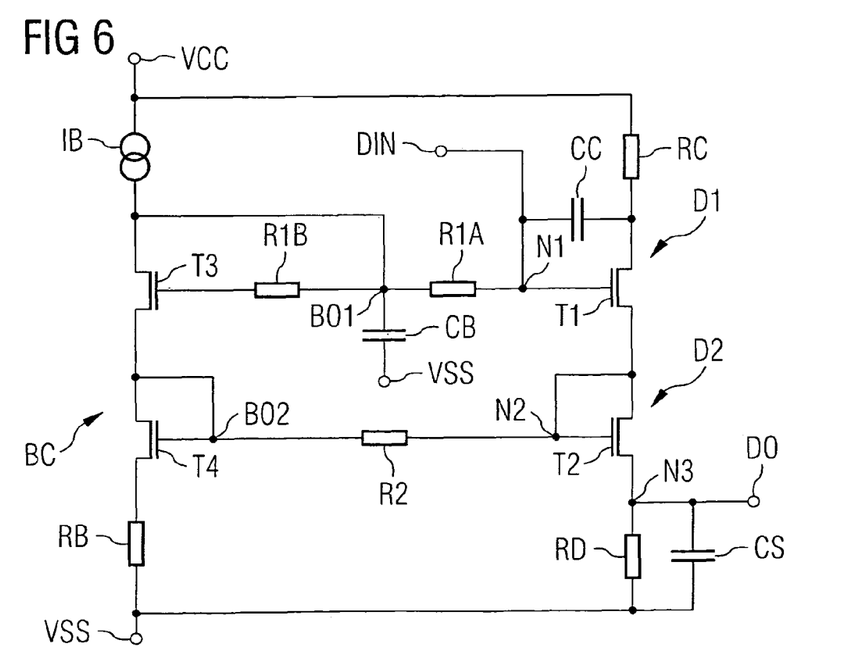
FIG. 6 is a schematic diagram illustrating a fifth embodiment of a detection circuit.

FIG. 6 shows another embodiment of a detection circuit in which the bipolar transistors of the embodiment shown in FIG. 5 are replaced by field-effect transistors. Accordingly, in one embodiment, the field-effect transistors T1, T2, T3, T4 are wired as diodes, wherein a drain and a gate terminal of the first transistor T1 are coupled via the capacitor CC, and the gate and the drain terminal of the transistor T3 are coupled via the resistor R1B. The storage element CS, RD comprises a resistor RD forming a discharging device.

Figure 7:
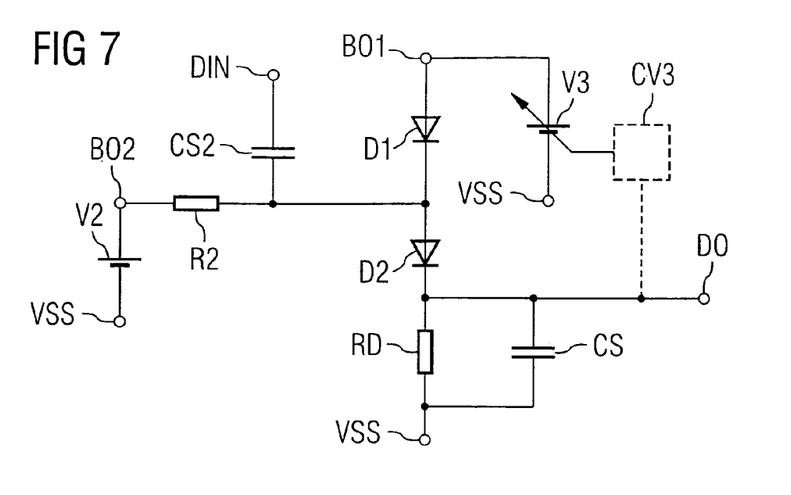
FIG. 7 is a schematic diagram illustrating a sixth embodiment of a detection circuit.

FIG. 7 shows an alternative embodiment of a detection circuit comprising a detector input DIN, a detector output DO and a bias circuit. The bias circuit comprises a first voltage source V3 to provide a first bias voltage at a first bias output BO1 and a second voltage source V2 coupled to a second bias output BO2 to provide a second bias voltage. The detection circuit further comprises a capacitive element CS2 with a first node which is coupled to the detector input DIN and a second node which is coupled to the second bias output BO2 via a resistive element R2. A series connection of a first and the second diode element D1, D2 is coupled between the first bias output BO1 and the detector output DO.

A connection node of the first and the second diode element D1, D2 is coupled to the second node of the capacitive element CS2. The detector output DO is coupled to a reference voltage tap via a further capacitive element comprising a resistive element RD connected in parallel to a capacitor CS. As described before, in one embodiment the resistor RD can also be replaced by a current source. The detection circuit can further comprise a control unit CV3 to control an output voltage of the first voltage source V3 depending on a voltage at the detector output DO.

The first diode element D1 is coupled between the first and the second bias output BO1. It is desirable that the first bias voltage is higher than the second bias voltage. Therefore, the diode element D1 is forward biased with a fixed voltage difference as long as no radio frequency signal is received by the detector input DIN. When providing a radio frequency signal at the detector input DIN, a voltage at the connection node between the first and the second diode element D1, D2 increases during the positive alternation of the radio frequency signal. Thus, the second diode element D2 is forward biased and conducts a current to the detector output DO and to the capacitive element CS, RD. A voltage of the capacitive element CS corresponds to the amplitude of the radio frequency signal in the mean voltage at the connection node of the first and the second diode element D1, D2.

Accordingly, during the negative alternation of the radio frequency signal, the diode element D2 is in a blocked state. As a voltage at the connection node of the first and the second diode element D1, D2 remains at a constant value, the capacitor CS2 is charged to a value corresponding to the amplitude of the radio frequency signal during the negative alternation. During the next positive alternation, the second bias voltage, the voltage stored in the capacitor CS2 and the instantaneous voltage of the radio frequency signal add up to the voltage at the connection node of the first and the second diode element D1, D2, which is higher compared to the respective voltage during the first positive alternation. As a consequence, the detection value stored in the capacitor CS increases by the value stored in the capacitor CS2.

In other words, the detection value stored in the capacitor CS depends not only directly on the amplitude of the radio frequency signal but also on the value stored in the capacitor CS2 which is a double dependency on the amplitude of the radio frequency signal. Therefore, smaller amplitudes of a radio frequency signal can be detected using the proposed detection circuit compared to a conventional detection circuit. The lower limit of the dynamic range of the detection circuit is lowered. As the voltage at the connection node of the first and the second diode element D1, D2 is dependent on the first and the second bias voltage and the voltage stored in the capacitor CS2, a maximum reverse bias voltage of the second diode element D2 corresponds to the amplitude of the radio frequency signal, as described before for the other embodiments. Therefore, the dynamic range of the detection circuit is also extended for higher input amplitudes.

To consider the voltage over the first diode element D1, the first bias voltage at the first bias output BO1 can be adjusted using the voltage source V3 as a function of the detection value at the detector output DO. If the detection value is increased depending on the charging effects of the capacitor CS2, the first bias voltage can be increased accordingly. In this case, the maximum negative voltage over the first diode element D1 corresponds to the amplitude of the radio frequency signal.

In case the amplitude of the radio frequency signal lowers, the capacitor CS2 can be discharged via the resistor R2. in one embodiment, the first and the second diode element can comprise transistors which are wired as diodes as shown in the previous embodiments.

Figure 8:
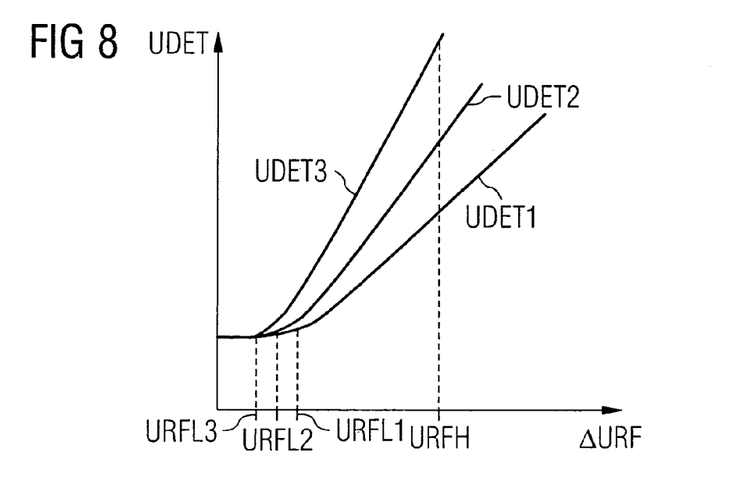
FIG. 8 is a graph illustrating an exemplary diagram of detection characteristics.

FIG. 8 shows an exemplary diagram of several detector characteristics. It shows the dependency of the detection value UDET on the signal amplitude ΔURF of the radio frequency signal. The curve UDET1 denotes an exemplary curve of a detection circuit according to one of the embodiments shown in FIG. 1 or FIGS. 2 to 6 in which the resistor R2 is high-ohmic. Starting from a fixed value corresponding to a bias voltage, the detection value increases nearly linearly with an increasing signal amplitude ΔURF. A lower limit of the dynamic range is defined by the voltage URFL1 denoting the predetermined slope of the curve UDET1. An upper limit is defined by the voltage URFH which corresponds to an exemplary breakdown voltage of the used diode elements.

If the resistance of the resistor R2 is lower in one of the above-mentioned embodiments, a characteristic curve UDET2 results which has an increased slope compared to the curve UDET1 and the reduced lower limit URFL2 for the dynamic range. As the upper limit corresponds to the breakdown voltage of the diode elements, it is the same as the upper limit for the curve DET1 in this example.

The curve UDET3 shows a characteristic of a detection circuit according to the embodiment shown in FIG. 7. Because of the double dependency on the signal amplitude ΔURF, the curve UDET3 comprises a steeper slope than the curves UDET1 and UDET2. Also the lower limit URFL3 is smaller than for the curves UDET1 and UDET2. Again, the upper limit URFH is equal to the previous embodiments. As a comparison, the upper limit of a conventional detection circuit would only be half the limit URFH of the curves UDET1, UDET2 and UDET3, because the breakdown voltage corresponds to almost twice the signal amplitude ΔURF of the radio frequency signal.

Figure 9:
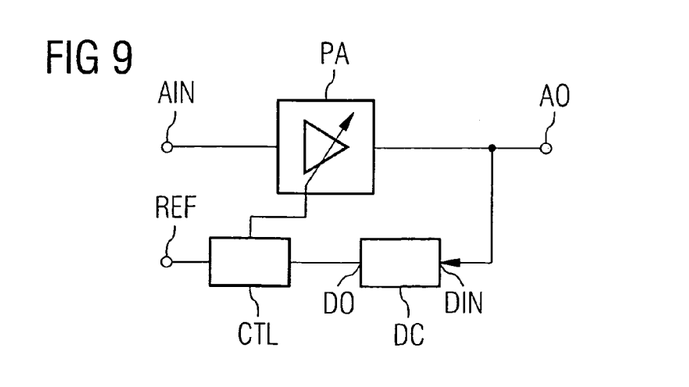
FIG. 9 is a block diagram illustrating an embodiment of a detection circuit with an amplifier.

FIG. 9 shows an exemplary embodiment of an amplifier arrangement which comprises an amplifier circuit PA and a detection circuit DC according to one of the proposed embodiments. The amplifier circuit PA, which can be a power amplifier, comprises an amplifier input AIN and an amplifier output AO which is coupled to the detector input DIN of the detection circuit DC.

The detection circuit comprises, for example, a bias circuit to generate a first bias voltage and a second bias voltage, a series connection of a first diode element and a second diode element, the series connection receiving the first bias voltage and an amplified radio frequency signal at a first tap, receiving the second bias voltage at a connection node of the first and the second diode element and providing a detection value at a second tap to be stored in a capacitive element. The detector output DO is coupled to a control unit CTL coupled to a reference input REF to receive a reference amplitude value. An output of the control unit CTL is coupled to a control input of the amplifier circuit PA to control a gain factor of the amplifier circuit PA.

A radio frequency signal is received at the amplifier input AIN and amplified using the amplifier circuit PA, thus generating an amplified radio frequency signal. The amplified radio frequency signal is provided to the detector input DIN of the detection circuit DC to derive the detection value corresponding to an amplitude of the amplified radio frequency signal and to provide the detection value to the control unit CTL. The control unit CTL compares the detection value to the reference amplitude value and generates an adapted control signal to adapt a gain factor of the amplifier circuit PA and the amplitude of the amplified radio frequency signal, respectively.

in one embodiment, the proposed detection circuit may be used within a mobile communication appliance. Therefore, it may be integrated together with an amplifier arrangement as proposed in the embodiment shown in FIG. 9. The detection circuit may be integrated in an integrated circuit in a semiconductor device in one embodiment. Alternatively, the detection circuit may also be built using discrete elements for the diode elements, the resistors, and the capacitive elements, for example on a printed circuit board.

Figure 10:
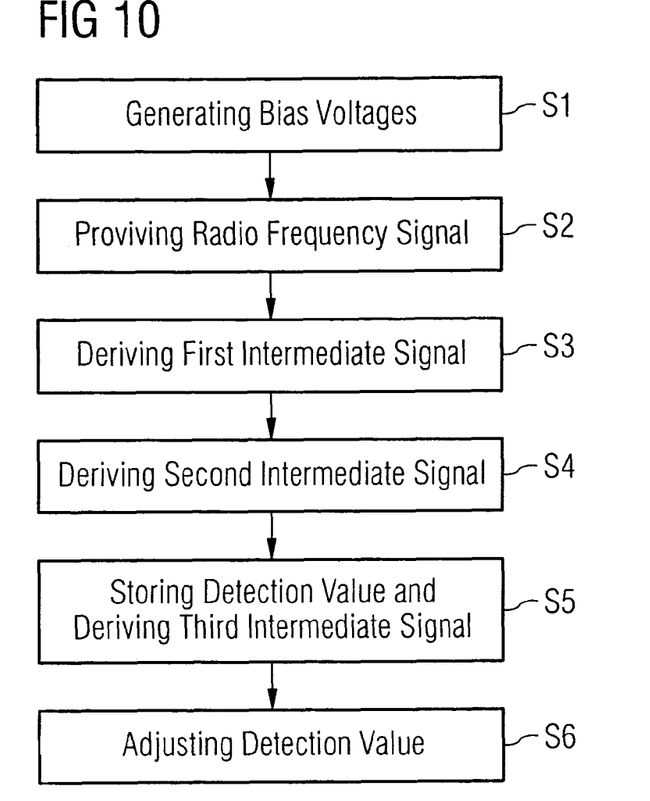
FIG. 10 is a flow chart diagram illustrating an exemplary embodiment of a detection method and FIG. 11 is a schematic diagram illustrating an embodiment of a conventional detection circuit.

FIG. 10 shows an exemplary embodiment of a detection method. While the method and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At S1 a first and a second bias voltage are generated. At S2 a radio frequency signal is provided which comprises a signal amplitude. At S3 a first intermediate signal is derived as a function of the first bias voltage and the radio frequency signal. For example, the first intermediate signal is derived by adding a voltage of the radio frequency signal to the first bias voltage. Therefore, the first intermediate signal corresponds to a radio frequency signal having a DC offset.

At S4 a second intermediate signal is derived by rectifying the first intermediate signal depending on the second bias voltage and an instantaneous value of the first intermediate signal. The rectifying can be performed by using a first diode element D1 in one embodiment. In this case the second intermediate signal corresponds to the first intermediate signal as long as the first intermediate signal is greater than the second bias voltage, neglecting a voltage drop of the diode element D1. If the first intermediate signal is less than the second bias voltage, the second intermediate signal corresponds to the second bias voltage.

At S5 a detection value corresponding to an amplitude of the radio frequency signal is stored. Furthermore, a third intermediate signal is derived by rectifying the second intermediate signal depending on the stored detection value and an instantaneous value of the second intermediate signal. The rectifying of the second intermediate signal can be performed by using a second diode element D2 in one embodiment.

At S6 the stored detection value is adjusted depending on the third intermediate signal. For example, the detection value is increased, if the instantaneous value of the third intermediate signal is greater than the stored detection value. The detection value is held or decreased, if the instantaneous value of the third intermediate signal is less than the stored detection value.

The detection value can be stored by charging of a capacitive element. Accordingly, adjusting the stored detection value can comprise a further charging of the capacitive element depending on the third intermediate signal, for example if the third intermediate is greater than an actual stored detection value. The adjusting of the stored detection value can also comprise discharging of the capacitive element depending on the third intermediate signal, for example if the third intermediate signal is less than the actual detection value. The discharging can be performed using a current source or a resistor connected in parallel to a capacitor of the capacitive element.

In one embodiment, deriving the second intermediate signal at S4 can comprise adapting the second bias voltage depending on the second intermediate signal. This can be the case, for example, if the second bias voltage is provided via a resistor which has a reduced resistance as described for the embodiment of FIG. 3.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A detection circuit, comprising:
   a detector input configured to receive a time varying detection signal;
   a detector output;
   a capacitive output element coupled to the detector output;
   a bias circuit comprising a first bias output configured to provide a first bias voltage and a second bias output configured to provide a second bias voltage;
   a transistor having a control terminal coupled to the detector input and a first terminal configured to be coupled to a supply voltage, wherein the control terminal is coupled to the first bias output and configured to receive a first intermediate signal as a function of the first bias voltage and the detection signal;

a coupling capacitance element coupled between the control terminal and the first terminal of the transistor, and configured to pass the time varying detection signal from the detector input to the first terminal and concurrently block a DC voltage from passing therethrough, thereby operating as a high pass filter;

a rectifying element comprising a first terminal coupled to a second terminal of the transistor and to the second bias output, and a second terminal coupled to the capacitive output element.

2. The detection circuit of claim 1, wherein the rectifying element comprises a diode-connected transistor having a control terminal coupled to the second bias output, a first terminal coupled to the second terminal of the transistor, and a second terminal coupled to the capacitive output element, wherein the control terminal and the first terminal are coupled together.

3. A detection circuit, comprising:

a detector input configured to receive a time varying detection signal;

a detector output;

a capacitive output element coupled to the detector output;

a bias circuit comprising a first bias output configured to provide a first bias voltage and a second bias output configured to provide a second bias voltage;

a first rectifying element coupled between the first bias output and the second bias output;

a second rectifying element coupled between the second bias output and the capacitive output element;

wherein the detector input is coupled to one of the first bias output and the second bias output; and a control unit coupled to the detector output, and configured to vary the first bias voltage based on an output voltage at the detector output.

4. The detection circuit of claim 3, wherein the first rectifying element comprises a diode having an anode coupled to the first bias output, and a cathode coupled to the second bias output.

5. The detection circuit of claim 3, wherein the first rectifying element comprises a diode-connected transistor having a control terminal and a first terminal coupled together and coupled to the first bias output, and a second terminal coupled to the second bias output.

6. The detection circuit of claim 3, wherein the second rectifying element comprises a diode having an anode coupled to the second bias output, and a cathode coupled to the detector output.

7. The detection circuit of claim 3, wherein the second rectifying element comprises a diode-connected transistor having a control terminal and a first terminal coupled together and coupled to the second bias output, and a second terminal coupled to the detector output.

8. The detection circuit of claim 3, further comprising an input capacitive element coupled between the detector input and the second bias output.

* * * * *

UNITED STATES PATENT AND TRADEMARK OFFICE
CERTIFICATE OF CORRECTION

| | |
|---|---|
| PATENT NO. | : 7,911,236 B2 |
| APPLICATION NO. | : 11/603888 |
| DATED | : March 22, 2011 |
| INVENTOR(S) | : Michael Asam |

It is certified that error appears in the above-identified patent and that said Letters Patent is hereby corrected as shown below:

Title Pg, Item (73), replace the Assignee "Intel Mobile Communications GmbH" with the correct Assignee of --Infineon Technologies AG--

Signed and Sealed this
Tenth Day of May, 2011

David J. Kappos
*Director of the United States Patent and Trademark Office*